US011705326B2

(12) United States Patent
Nakatani et al.

(10) Patent No.: US 11,705,326 B2
(45) Date of Patent: Jul. 18, 2023

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Hiroshi Ashihara, Toyama (JP); Motomu Degai, Toyama (JP); Kenji Kameda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 740 days.

(21) Appl. No.: 16/728,790

(22) Filed: Dec. 27, 2019

(65) Prior Publication Data

US 2020/0135455 A1    Apr. 30, 2020

Related U.S. Application Data

(63) Continuation of application No. PCT/JP2018/018353, filed on May 11, 2018.

(30) Foreign Application Priority Data

Jun. 27, 2017 (JP) .................. 2017-125452

(51) Int. Cl.
*H01L 21/02* (2006.01)
*H01L 21/311* (2006.01)

(52) U.S. Cl.
CPC .... *H01L 21/02214* (2013.01); *H01L 21/0214* (2013.01); *H01L 21/02186* (2013.01); *H01L 21/31111* (2013.01)

(58) Field of Classification Search
CPC ............... H01L 21/02214; H01L 21/02; H01L 21/0214; H01L 21/02186; H01L 21/31111;
(Continued)

(56) References Cited

U.S. PATENT DOCUMENTS 9,905,638 B1 * 2/2018 Tominari .......... H01L 21/30604
2003/0139012 A1    7/2003 Yamauchi et al.
(Continued)

FOREIGN PATENT DOCUMENTS

JP    10-321556 A    12/1998
JP    2003-218036 A    7/2003
(Continued)

OTHER PUBLICATIONS

International Search Report for PCT/JP2018/018353, dated Jul. 24, 2018.
(Continued)

*Primary Examiner* — Calvin Y Choi
(74) *Attorney, Agent, or Firm* — Volpe Koenig

(57) ABSTRACT

There is provided a technique that includes filling a concave portion formed on a surface of a substrate with a first film and a second film by performing: (a) forming the first film having a hollow portion using a first precursor so as to fill the concave portion formed on the surface of the substrate; (b) etching a portion of the first film which makes contact with the hollow portion, using an etching agent; and (c) forming the second film on the first film of which the portion is etched, using a second precursor, wherein (b) includes performing, a predetermined number of times: (b-1) modifying a portion of the first film using a modifying agent; and (b-2) selectively etching the modified portion of the first film using the etching agent.

18 Claims, 7 Drawing Sheets

(58) Field of Classification Search
CPC .............. H01L 21/311; H01L 21/02381; H01L 21/0245; H01L 21/02532; H01L 21/0262; H01L 21/02658; H01L 21/76883; H01L 21/768; H01L 21/302; H01L 21/32105; H01L 21/321; H01L 21/32135; C23C 16/045; C23C 16/04; C23C 16/52; C23C 16/56; C23C 16/24
See application file for complete search history.

(56) References Cited

U.S. PATENT DOCUMENTS

2016/0233105 A1* 8/2016 Li .................... H01L 21/02164
2016/0358794 A1* 12/2016 Miura ............... C23C 16/45551

FOREIGN PATENT DOCUMENTS

| | | | |
|---|---|---|---|
| JP | 2003-218037 | A | 7/2003 |
| JP | 2006-024730 | A | 1/2006 |
| JP | 2015-012243 | A | 1/2015 |
| KR | 2009-0095391 | A | 9/2009 |
| WO | 2015/001991 | A1 | 1/2015 |

OTHER PUBLICATIONS

Korean Office Action dated Dec. 22, 2020 for Korean Patent Application No. 10-2019-7038449.

* cited by examiner

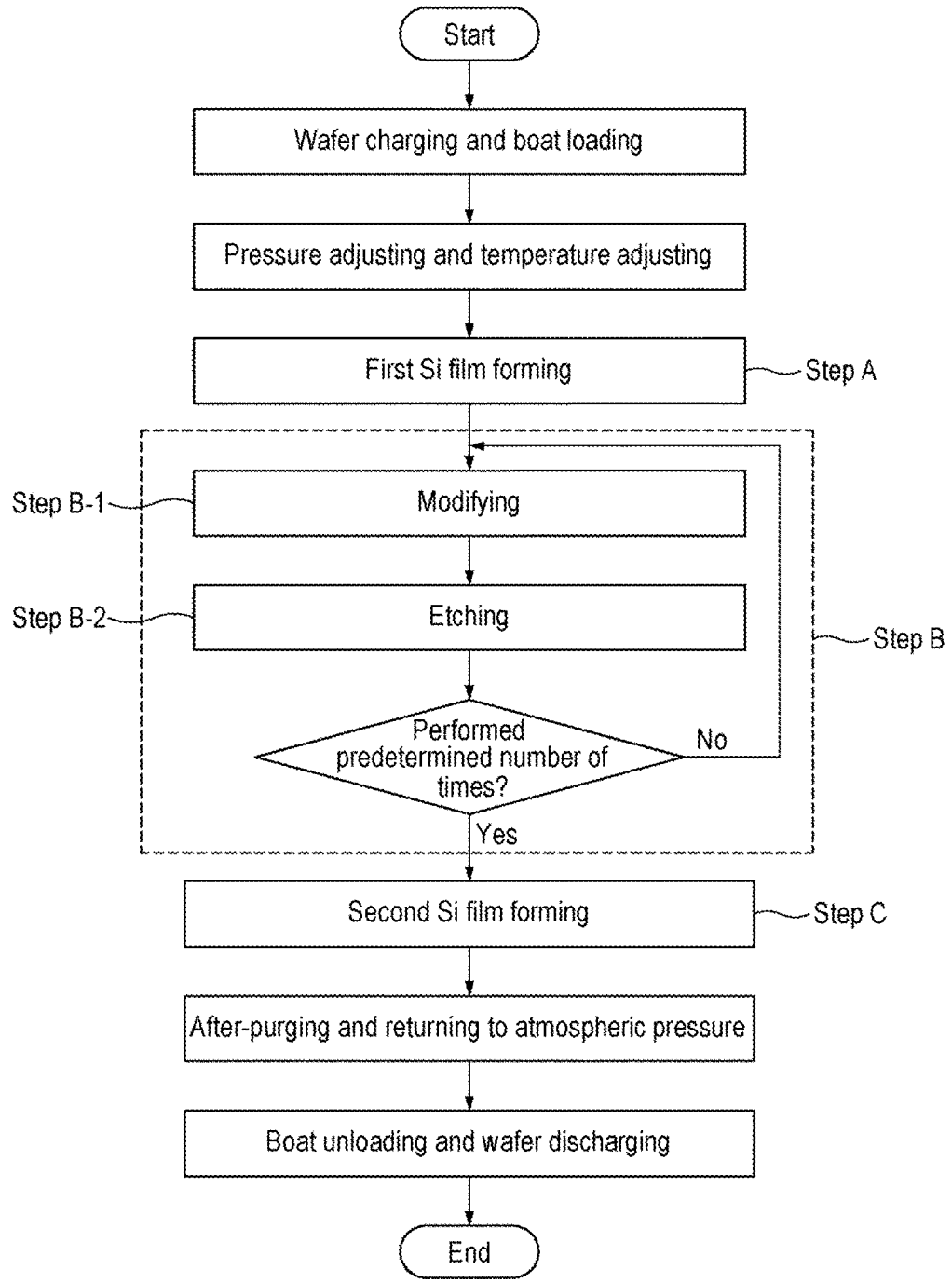

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2018/018353, filed on May 11, 2018, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a substrate processing process of forming a film by supplying a precursor to a substrate on which a concave portion, such as a trench or a hole, is formed on its surface so as to fill the concave portion is often carried out.

SUMMARY

The present disclosure provides some embodiments of a technique capable of improving filling characteristics of a film in a concave portion formed on a surface of a substrate.

According to one or more embodiments of the present disclosure, there is provided a technique that includes filling a concave portion formed on a surface of a substrate with a first film and a second film by performing: (a) forming the first film having a hollow portion using a first precursor so as to fill the concave portion formed on the surface of the substrate; (b) etching a portion of the first film which makes contact with the hollow portion, using an etching agent; and (c) forming the second film on the first film of which the portion is etched, using a second precursor, wherein (b) includes performing, a predetermined number of times: (b-1) modifying a portion of the first film using a modifying agent; and (b-2) selectively etching the modified portion of the first film using the etching agent.

BRIEF DESCRIPTION OF DRAWINGS

FIG. 4 is a flowchart illustrating a substrate processing sequence according to the embodiments of the present disclosure.

DETAILED DESCRIPTION

One or More Embodiments of the Present Disclosure

One or more embodiments of the present disclosure will now be described with reference to FIGS. 1 to 5F.

(1) Configuration of the Substrate Processing Apparatus

Figure 1:
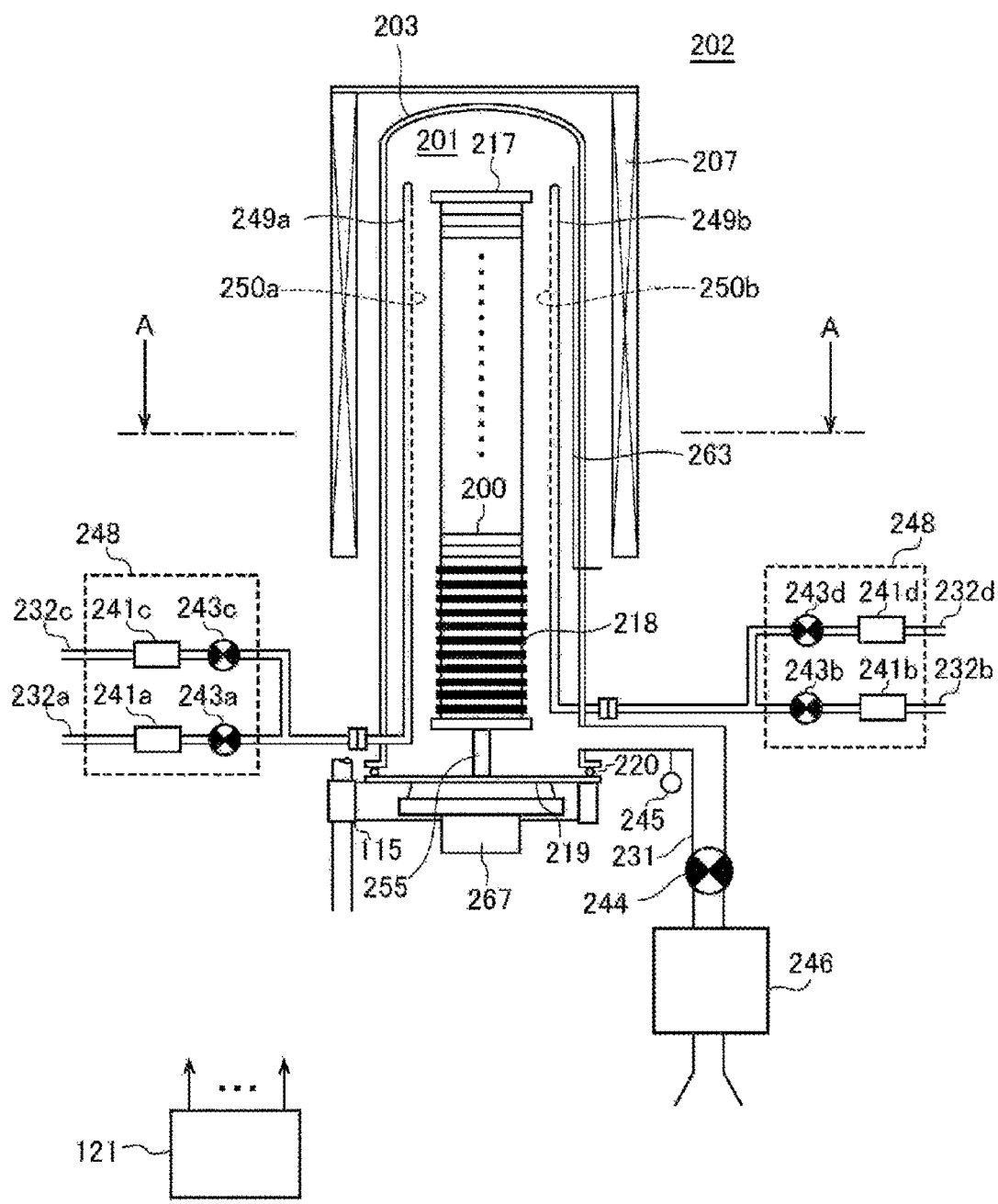
FIG. 1 is a schematic configuration diagram of a vertical type process furnace of a substrate processing apparatus suitably used in the embodiments of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. Similar to the heater 207, the reaction tube 203 is vertically installed. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate a lower sidewall of the reaction tube 203. Gas supply pipes 232a and 232b are respectively connected to the nozzles 249a and 249b.

Mass flow controllers (MFCs) 241a and 241b, which are flow rate controllers (flow rate control parts), and valves 243a and 243b, which are openings closing valves, are installed in the gas supply pipes 232a and 232b sequentially from the corresponding upstream sides of gas flow, respectively. Gas supply pipes 232c and 232d, which supply an inert gas, are respectively connected to the gas supply pipes 232a and 232b at the downstream side of the valves 243a and 243b. MFCs 241c and 241d, and valves 243c and 243d are respectively installed in the gas supply pipes 232c and 232d sequentially from the corresponding upstream sides of gas flow.

Figure 2:
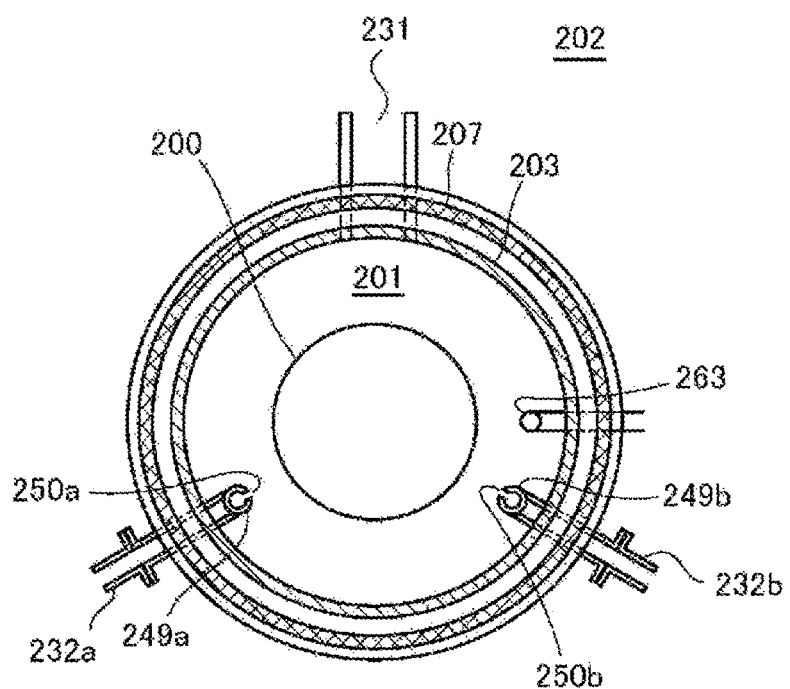
FIG. 2 is a schematic configuration diagram of a vertical type process furnace of the substrate processing apparatus suitably used in the embodiments of the present disclosure, in which a portion of the process furnace is shown in a cross sectional view taken along line A-A in FIG. 1.

As illustrated in FIG. 2, the nozzles 249a and 249b are installed in a space with an annular plan-view shape between the inner wall of the reaction tube 203 and the wafers 200 so as to extend upward along a stacking direction of the wafers 200 from a lower portion of the inner wall of the reaction tube 203 to an upper portion of the inner wall of the reaction tube 203. That is, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are respectively formed on the side surfaces of the nozzles 249a and 249b. The gas supply holes 250a and 250b are opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203.

As a precursor (a first precursor and a second precursor), for example, a silicon (Si)-containing gas, is supplied from the gas supply pipe 232a into the process chamber 201 via the MFC 241a, the valve 243a, and the nozzle 249a. As the Si-containing gas, it may be possible to use, for example, a silicon hydride gas such as a monosilane ($SiH_4$, abbreviation; MS) gas, or the like.

As a modifying agent (oxidizing agent), for example, an oxygen (O)-containing gas, is supplied from the gas supply pipe 232b into the process chamber 201 via the MFC 241b, the valve 243b, and the nozzle 249b. As the O-containing gas, it may be possible to use, tor example, an oxygen ($O_2$) gas.

As an etching agent, for example, a hydrogen fluoride (HF) gas containing hydrogen (H) and fluorine (F), is supplied from the gas supply pipe 232b into the process chamber 201 via the MFC 241b, the valve 243b, and the nozzle 249b.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b.

A precursor supply system is mainly configured by the gas supply pipe 232a, the MFC 241a, and the valve 243a. A modifying agent supply system and an etching agent supply system are each mainly configured by the gas supply pipe 232b, the MFC 241b, and the valve 243b. An inert gas supply system is mainly configured by the gas supply pipes 232c and 232d, the MFCs 241c and 241d, and the valves 243c and 243d.

One or all of various supply systems described above may be configured as an integrated supply system 248 in which the valves 243a to 243d, the MFCs 241a to 241d, and the like are integrated. The integrated supply system 248 is connected to each of the gas supply pipes 232a to 232d so that a supply operation of various kinds of gases into the gas supply pipes 232a to 232d, i.e., an opening/closing operation of the valves 243a to 243d, a flow rate adjusting operation by the MFCs 241a to 241d or the like, is controlled by a controller 121 which will be described later. The integrated supply system 248 is configured as an integral type or division type integrated unit, and is also configured so that it is detachable from the gas supply pipes 232a to 232d or the like, so as to perform maintenance, replacement, expansion, or the like of the integrated supply system 248, on an integrated unit basis.

An exhaust pipe 231 configured to exhaust an internal atmosphere of the process chamber 201 is connected to the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure adjustment part). The APC valve 244 is configured so that a vacuum exhaust of the interior of the process chamber 201 and a vacuum exhaust stop can Ire performed by opening and closing the APC valve 244 while operating the vacuum pump 246 and so that the internal pressure of tire process chamber 201 can be adjusted by adjusting an opening degree of the APC valve 244 based on pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of a metal material such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
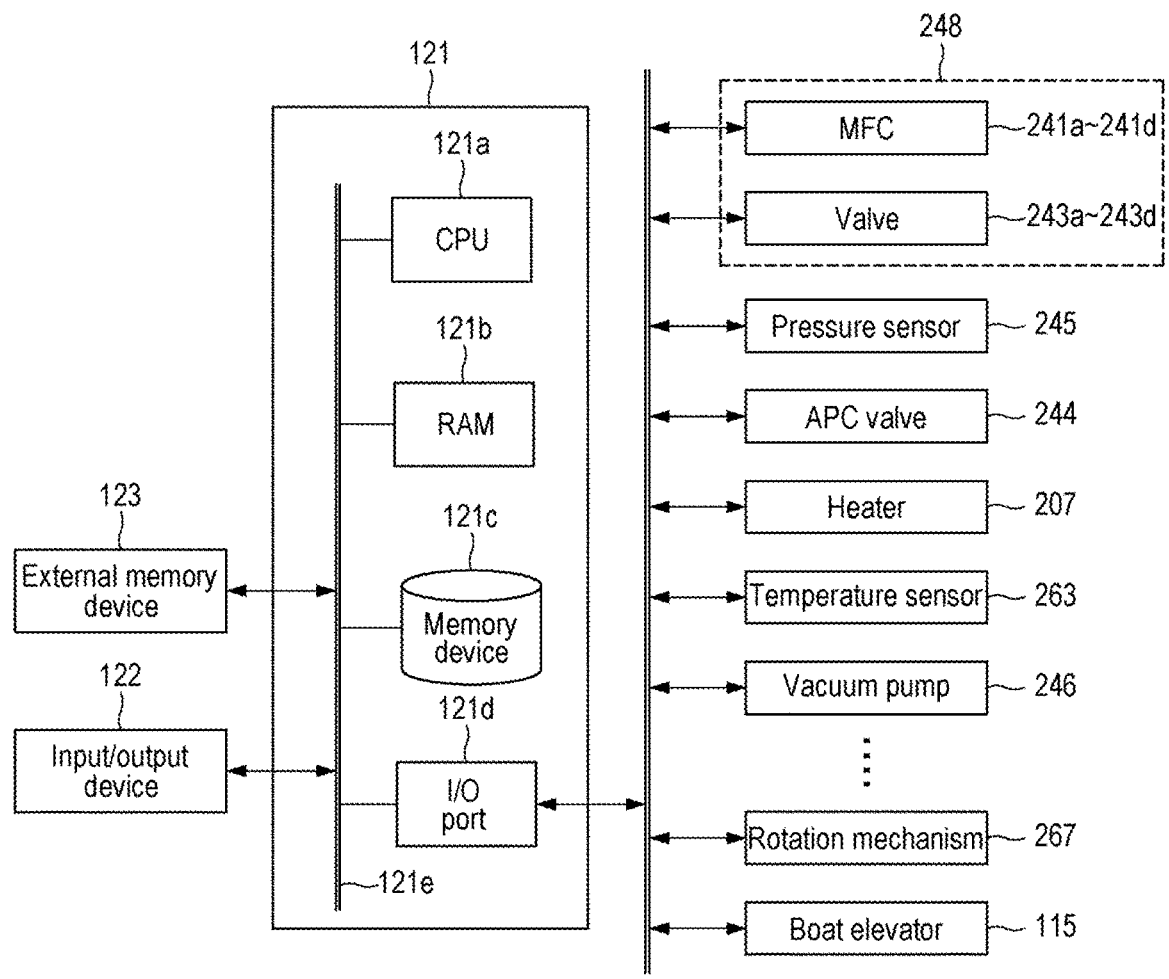
FIG. 3 is a schematic configuration diagram of a controller of the substrate processing apparatus suitably used in one or more embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, or the like read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up or down with the boat elevator 115, and the like.

The controller 121 may be configured by installing, on the computer, the aforementioned program stored in an external memory device 123 (for example, a magnetic disc such as a HDD, an optical disc such as a CD, a magneto-optical disc such as an MO, a semiconductor memory such as a USB memory, or the like). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A sequence example of filling a concave portion formed on a surface of a wafer 200 as a substrate with a silicon film (Si film) without a gap (a void, a seam, or the like) using the aforementioned substrate processing apparatus, which is one of the processes for manufacturing a semiconductor device, will be described with reference to FIGS. 4 and 5A to 5F. In the following descriptions, the operations of the respective parts constituting the substrate processing apparatus are controlled by the controller 121.

In the substrate processing sequence illustrated in FIGS. 4 and 5A to 5F, a concave portion is filled with a first Si film and a second Si film by performing: Step A of forming the first film (first Si film) having a hollow portion so as to fill the concave portion formed a surface of a wafer 200 using a MS gas as a first precursor; Step B of etching a portion of the first Si film which makes contact with the hollow portion using a HF gas as an etching agent; and Step C of forming the second film (second Si film) on the first Si film which is partially etched using a MS gas as a second precursor.

Furthermore, at Step B, Step B-1 of modifying a portion of the first Si film using an Oz gas as a modifying agent; and Step B-2 of selectively etching the modified portion of the first Si film using a HF gas as an etching agent are performed a predetermined number of times (one or more times, here, twice as an example).

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

Figure 5A:
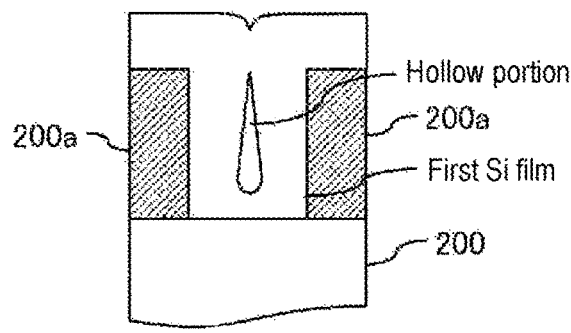
FIG. 5A is an enlarged cross sectional view illustrating a surface structure of a wafer after forming a first film having a hollow portion.

For example, a Si substrate made of single crystal Si or a substrate on which a single crystal Si film is formed on its surface may be used as the wafers 200. As illustrated in FIG. 5A, a concave portion is formed on a surface of a wafer 200. The bottom portion of the concave portion is made of single crystal Si, and the side portion and upper portion of the concave portion are formed by an insulating film 200a such as a silicon oxide film (SiO film), a silicon nitride (SiN film), a silicon oxycarbonitride (SiOCN film), or the like.

(Pressure Adjusting and Temperature Adjusting)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Step A)

Thereafter, a MS gas is supplied to the wafer 200 in the process chamber 201. At this step, the valve 243a may be opened to allow a MS gas to flow through the gas supply pipe 232a. The flow rate of the MS gas is adjusted by the MFC 241a. The MS gas is supplied into the process chamber 201 via the nozzle 249a and is exhausted from the exhaust pipe 231. In this operation, the MS gas is supplied to the wafer 200 under a non-plasma atmosphere. Simultaneously, the valves 243c and 243d may be opened to allow a $N_2$ gas to flow through the gas supply pipes 232c and 232d. The flow rate of the $N_2$ gas is adjusted by the MFCs 241c and 241d. The $N_2$ gas is supplied into the process chamber 201 via the nozzles 249a and 249b.

By supplying the MS gas to the wafer 200, as illustrated in FIG. 5A, a first Si film can be formed so as to fill the concave portion. However, in this film-forming process, the surface side of the concave portion is closed by the first Si film grow n to overhang from the side portion and upper portion of the concave portion. A non-filled region extending in a depth region (direction), i.e., a hollow portion, is formed in the concave portion. The hollow portion is generated when the surface side of the concave portion is closed before the inside of the concave portion is completely filled with the first Si film, the MS gas does not reach the inside of the concave portion and the growth of the first Si film in the concave portion stops. The hollow portion is formed inside the first Si film, and becomes a closed space having no opening in its upper portion. Due to these factors, the first Si film becomes a film having a hollow portion therein. The hollow portion is likely to be generated when the aspect ratio of the concave portion (the depth of the concave portion/the width of the concave portion) is increased, specifically, when the aspect ratio is 1 or more, e.g., 20 or more, and further 50 or more.

After the first Si film is formed, the valve 243a is closed to stop the supply of the MS gas into the process chamber 201. Then, the interior of the process chamber 201 is vacuum-exhausted, and the gas or the like, which remains within the process chamber 201, is removed from the interior of the process chamber 201. In this operation, the valves 243c and 243d are opened to supply a $N_2$ gas into the process chamber 201. The $N_2$ gas acts as a purge gas.

The processing conditions at this step may be exemplified as follows:
MS gas supply flow rate: 10 to 2,000 sccm
$N_2$ gas supply flow rate (for each gas supply pipe): 100 to 10,000 sccm
Supply time of gas: 20 to 400 minutes Processing temperature: 450 to 550 degrees C., or 450 to 530 degrees C. in some embodiments
Processing pressure: 1 to 900 Pa.

As the first precursor (Si-containing gas), it may be possible to use a silicon hydride gas expressed by a general formula $Si_nH_{2n+2}$ (where n is an integer of 1 or more) such as a disilane ($Si_2H_6$, abbreviation: DS) gas; a trisilane ($Si_3H_8$) gas, a tetrasilane ($Si_4H_{10}$) gas, or the like, as well as the MS gas. As the first precursor, it may also be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, or the like. This also applies to the second precursor as described hereinbelow.

As the inert gas, it may be possible to use a rare gas such as an Ar gas, a He gas, a Ne gas, a Xe gas, or the like, as well as the $N_2$ gas. This also applies to each step as described hereinbelow.

(Step B)

After the Step A is completed, the Steps B-1 and B-2 are performed a predetermined number of times (here, twice as an example).

[Step B-1 (First Time)]

At this step, an $O_2$ gas is supplied to the wafer 200 in the process chamber 201, i.e., the first Si film formed on the wafer 200. Specifically, the opening/closing control of the valves 243b to 243d is performed in the same procedure as the opening/closing control of the valves 243a, 243c and 243d at the Step A described above. The flow rate of the $O_2$ gas flowing through the gas supply pipe 232b is adjusted by the MFC 241b. The $O_2$ gas is supplied into the process chamber 201 via the nozzle 249b and is exhausted from the exhaust pipe 231. In this operation, the $O_2$ gas is supplied to the wafer 200 under a non-plasma atmosphere.

Figure 5B:
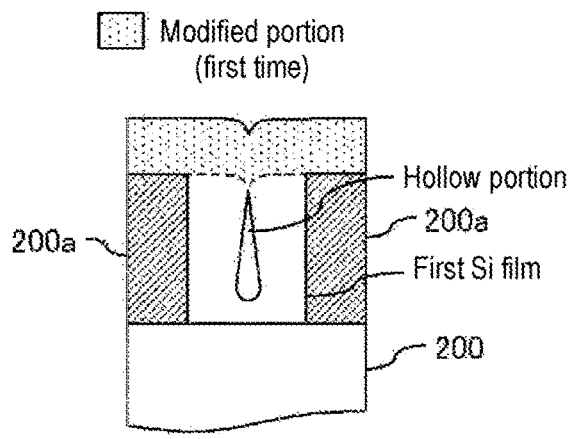
FIG. 5B is an enlarged cross sectional view illustrating a surface structure of a wafer after modifying (first time) a portion of the first film.

By supplying the $O_2$ gas to the wafer 200, as illustrated in FIG. 5B, a portion of the first Si film formed on the wafer 200 can be modified. Specifically, a portion of the first Si film above the hollow portion which docs not make contact with the hollow portion can be modified into SiO by oxidation. Furthermore, the oxidation reaction proceeds by diffusion of O atoms into the first Si film. In FIG. 5B, the portion of the first Si film which has been modified into SiO is indicated by shading. As described above, the hollow portion is a closed space having no opening. Therefore, the $O_2$ gas is not supplied into the hollow portion, and at this step, a portion of the first Si film which makes contact with the hollow portion (hereinafter, also referred to as an "inner wall of the hollow portion" for the sake of convenience) can be kept (maintained) as it is, without being modified.

After the modification of the portion of the first Si film above the hollow portion which does not make contact with the hollow portion is completed, the valve 243b is closed to stop the supply of the $O_2$ gas into the process chamber 201. Then, the interior of the process chamber 201 is vacuum-exhausted, and the gas or the like, which remains within the process chamber 201, is removed from the interior of the process chamber 201 according to the same processing procedures as those of the Step A.

The processing conditions at this step may be exemplified as follows:
$O_2$ gas supply flow rate: 10 to 5,000 sccm
$N_2$ gas supply flow rate (for each gas supply pipe): 0 to 10,000 sccm
Supply time of gas: 1 to 30 minutes Processing temperature: 450 to 550 degrees C., or 450 to 530 degrees C. in some embodiments Processing pressure: 1 to 4,000 Pa.

As the modifying agent (O-containing gas), it may be possible to use, for example, a nitrous oxide ($N_2O$) gas, a nitrogen monoxide (NO) gas, a nitrogen dioxide ($NO_2$) gas, a hydrogen peroxide ($H_2O_2$) gas, an ozone ($O_3$) gas, a hydrogen ($H_2$) gas+$O_2$ gas, a $H_2$ gas+$O_3$ gas, water vapor ($H_2O$), a carbon monoxide (CO) gas, a carbon dioxide ($CO_2$) gas, or the like, as well as the $O_2$ gas.

[Step B-2 (First Time)]

After the Step B-1 (first time) is completed, a HF gas is supplied to the wafer 200 in the process chamber 201, i.e., the first Si film formed on the wafer 200 and partially modified. Specifically, the opening/closing control of the valves 243b to 243d is performed in the same procedure as the opening/closing control of the valves 243a, 243c and 243d at the Step A described above. The flow rate of the HF gas flowing through the gas supply pipe 232b is adjusted by the MFC 241b. The HF gas is supplied into the process chamber 201 via the nozzle 249b and is exhausted from the exhaust pipe 231. In this operation, the HF gas is supplied to the wafer 200 under a non-plasma atmosphere.

Figure 5C:
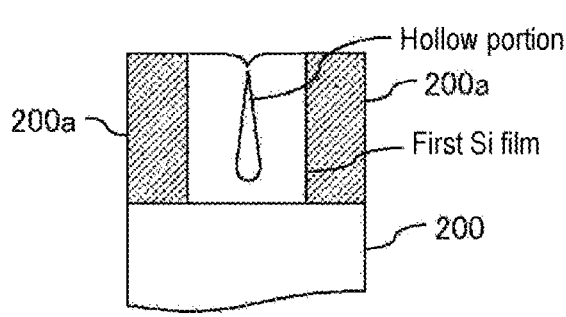
FIG. 5C is an enlarged cross sectional view illustrating a surface structure of a wafer after selectively etching (first time) the modified portion of the first film.

By supplying the HF gas to the wafer 200, as illustrated in FIG. 5C, the modified portion of the first Si film (shaded portion in FIG. 5B) can be selectively etched. When the HF gas is supplied under processing conditions as described hereinbelow, the etching rate of the modified portion of the first Si film is much higher than the etching rate of an unmodified portion of the first Si film. Alternatively, the modified portion of the first Si film may be etched without etching the unmodified portion of the first Si film. That is, specifying the target region of etching, the end point of etching, and the like at the Step B-2 (first time) can be substantially controlled by the modification process at the Step B-1 (first time). By performing this step, the portion (modified portion) of the first Si film above the hollow portion which does not make contact with the hollow portion can be removed In addition, the portion of the first Si film which makes contact with the hollow portion (the portion which has not been modified) can be kept (maintained) as it is, without being removed. At this step, it is possible to maintain a state where the hollow portion is not in communication with the outside of the first Si film, i.e., a state where the upper portion of the hollow portion is closed by the first Si film and the inside of the hollow portion is not exposed.

After the etching of the portion of the first Si film above the hollow portion which does not make contact with the hollow portion is completed, the valve 243b is closed to stop the supply of the HF gas into the process chamber 201. Then, the interior of the process chamber 201 is vacuum-exhausted, and the gas or the like, which remains within the process chamber 201, is removed from the interior of the process chamber 201 according to the same processing procedures as those of the Step A.

The processing conditions at this step may be exemplified as follows:

HF gas supply flow rate: 100 to 10,000 sccm $N_2$ gas supply flow rate (for each gas supply pipe): 0 to 10,000 sccm Supply time of gas: 1 to 60 minutes Processing temperature: 0 to 100 degrees C., or room temperature (25 degrees C.) to 50 degrees C. in some embodiments Processing pressure: 133 to 53,329 Pa, or 667 to 39,997 Pa in some embodiments.

As the etching agent, it may be possible to use HF aqueous solution or the like, as well as the HF gas.

[Step B-1 (Second Time)]

After the Step B-2 (first time) is completed, an $O_2$ gas is supplied to the wafer 200 in the process chamber 201, i.e., the first Si film formed on the wafer 200 and partially etched, according to the same processing procedures and processing conditions as those of the Step B-1 (first time) described above.

Figure 5D:
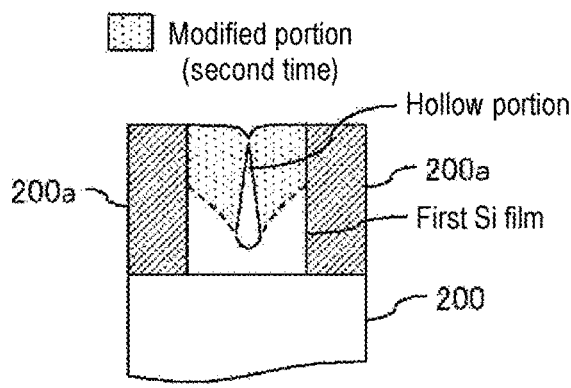
FIG. 5D is an enlarged cross sectional view illustrating a surface structure of a wafer after modifying (second time) a portion of the first film.

By supplying the $O_2$ gas to the wafer 200, as illustrated in FIG. 5D, the portion of the first Si film formed on the wafer 200 and partially etched can be further modified. Specifically, the portion of the first Si film remaining within the concave portion, which makes contact with the hollow portion (the upper portion or the central portion), can be modified into SiO by oxidation. In FIG. 5D, the modified portion of the first Si film remaining within the concave portion, which has been modified into SiO, is indicated by shading. As described above, the hollow portion is a closed space having no opening. Therefore, the $O_2$ gas is not supplied into the hollow portion, and at this step, at least the lower portion (bottom portion) of the portion of the first Si film which makes contact with the hollow portion (inner wall of the hollow portion) remaining within the concave portion, can be kept (maintained) as it is, without being modified.

After the modification of the portion of the first Si film which makes contact with the hollow portion remaining within the concave portion is completed, the valve 243b is closed to stop the supply of the $O_2$ gas into the process chamber 201. Then, the interior of the process chamber 201 is vacuum-exhausted, and the gas or the like, which remains within the process chamber 201, is removed from the interior of the process chamber 201 according to the same processing procedures as those of the Step A.

[Step B-2 (Second Time)]

After the Step B-1 (second time) is completed, a HF gas is supplied to the wafer 200 in the process chamber 201, i.e., the first Si film remaining within the concave portion in the surface of the wafer 200 and partially modified, according to the same processing procedures and processing conditions as those of the Step B-2 (first time) described above.

Figure 5E:
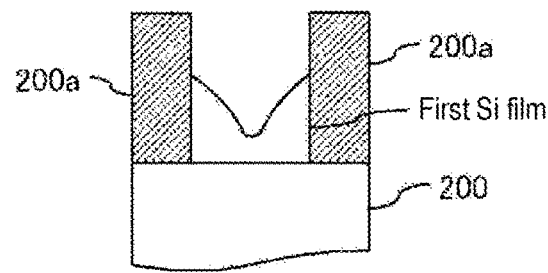
FIG. 5E is an enlarged cross sectional view illustrating a surface structure of a wafer after selectively etching (second time) the modified portion of the first film.

By supplying the HF gas to the wafer 200, as illustrated in FIG. 5E, the modified portion of the first Si film remaining within the concave portion (shaded portion in FIG. 5D) can be selectively etched. When the HF gas is supplied under the processing conditions at this step, the etching rate of the modified portion of the first Si film is much higher than the etching rate of the unmodified portion of the first Si film, as at the Step B-2 (first time). Alternatively, the modified portion of the first Si film may be etched without etching the unmodified portion of the first Si film. That is, specifying the target region of etching, the end point of etching, and the like at the Step B-2 (second time) can be substantially controlled by the modification process at the Step B-1 (second time). By performing this step, the modified portion of the first Si film which makes contact with the hollow portion remaining within the concave portion (the upper portion or the central portion) can be removed. Furthermore, the portion (unmodified portion) of the first Si film which makes contact with the lower portion (bottom portion) of the hollow portion can be kept as it is, without being removed. At this step, the upper portion of the hollow portion can be opened, and the hollow portion can be in communication with the outside of the first Si film to be exposed. In addition, the width of the upper opening of the hollow portion can be increased and the width of the bottom portion of the hollow portion can be maintained without being increased. By maintaining at least the bottom portion of the hollow portion in its original shape, the vertical cross sectional shape of the opened hollow portion can become a V shape or an inverted trapezoidal shape in which the opening width gradually increases from the bottom portion side toward the surface side.

After the etching of the modified portion of the first Si film which makes contact with the hollow portion remaining within the concave portion is completed, the valve 243b is closed to stop the supply of the HF gas into the process chamber 201. Then, the interior of the process chamber 201 is vacuum-exhausted, and the gas or the like, which remains within the process chamber 201, is removed from the interior of the process chamber 201 according to the same procedures as those of the Step A.

(Step C)

Thereafter, a MS gas is supplied to the wafer 200 in the process chamber 201, i.e., the first Si film formed on the wafer 200 and etched twice, according to the same processing procedures as those of the Step A. The supply time of the MS gas may be set at a time which falls within a range of, e.g., 10 to 300 minutes. Other processing conditions may be similar to the processing conditions of the Step A.

Figure 5F:
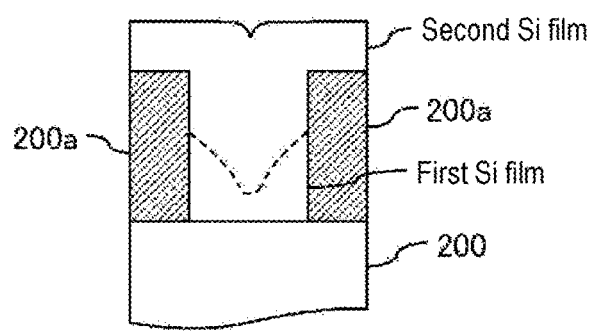
FIG. 5F is an enlarged cross sectional view illustrating a surface structure of a wafer after forming a second film on the first film which is partially etched.

By supplying the MS gas to the wafer 200, as illustrated in FIG. 5F, the second Si film can be formed on the wafer 200, i.e., on the surface of the first Si film etched twice. As described above, by performing the Step B-2 (second time), the hollow portion of the first Si film may be in a state where its upper portion is opened and exposed, and the vertical cross section shape thereof is processed in a V shape or the like in which its opening width gradually increases from the bottom side toward the surface side. Thus, the second Si film does not grow to overhang from the side portion of the opened hollow portion or the like. That is, the surface side of the opened hollow portion may nut be closed and the MS gas can reach the inside of the hollow portion. As a result, a non-filled region, i.e., a hollow portion, is not formed in the second Si film.

In this respect, at this step, it is possible to reliably supply the MS gas into the hollow portion and to reliably allow the film-forming; process in the hollow portion to proceed. As a result, the second Si film having no hollow portion can be formed in the opened hollow portion, and the inside of the concave portion formed on the wafer 200 can be filled completely with the first Si film and the second Si film, i.e., in a void-free and seamless state.

Thereafter, the valve 243a is closed to stop the supply of the MS gas into the process chamber 201. Then, the interior of the process chamber 201 is vacuum-exhausted, and the gas or the like, which remains within the process chamber 201, is removed from the interior of the process chamber 201 according to the same processing procedures as those of the Step A.

(After-Purging and Returning to Atmospheric Pressure)

After the Step C is completed, the $N_2$ gas is supplied from each of the gas supply pipes 232c and 232d into the process chamber 201 and is exhausted from the exhaust pipe 231. The $N_2$ gas acts as a purge gas. Thus, the interior of the process chamber 201 is purged with an inert gas, and the residual gas or the reaction byproduct, which remains within the process chamber 201, is removed from the interior of the process chamber 201 (after-purging). Thereafter, the internal atmosphere of the process chamber 201 is substituted by an inert gas (inert gas substitution). The internal pressure of the process chamber 201 is returned to an atmospheric pressure (returning to atmospheric pressure).

(Boat Unloading and Wafer Discharging)

Thereafter, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). The processed wafers 200 are discharged from the boat 217 (wafer discharging).

(3) Effects According to the Present Embodiments

According to the present embodiments, one or more effects as set forth below may be achieved.

(a) In the etching process of the Si film using the etching agent, the uniformity of the etching amount may be difficult to be controlled. On the other hand, in the modification (oxidation) process in which the reaction proceeds by diffusion of O atoms or the like into the Si film the uniformity of modification amount can be relatively easily controlled. For example, by adjusting the supply time of the modifying agent, the uniformity with higher modification amount tends to be easily obtained. In the present embodiments, as described above, specifying the target region of etching, the end point of etching, and the like at the Step B-2 can be, substantially controlled by the modification process at the Step B-1, which is performed before the Step B-2. Therefore, it is possible to improve the uniformity of the etching process performed at the Step B-2 by improving the uniformity of the modification process performed at the Step B-1. As a result, it is possible to make the surface shape of the first Si film after etching, i.e., the vertical cross sectional shape of the opened hollow portion, in a shape suitable for filling (for example, a V shape or the like), and to improve the filling characteristics in the concave portion by the Si film.

(b) In the etching process of the Si film using the etching agent, a large amount of etching damage may remain in the Si film after the process. On the other hand, in the present embodiments, the etching process at the Step B-2 proceeds on the portion of the first Si film which has been modified by performing the Step B-1, and does not proceed on the portion of the first Si film which has not been modified. In the present embodiments, the etching damage of the first Si film received by performing the Step B-2 can be significantly reduced. As a result, the inside of the concave portion can be filled with a high quality Si film with little etching, damage.

(c) At the Step B-1 (first time), the portion above the hollow portion which does not make contact with the hollow portion is modified, and at the Step B-2 (first time), the hollow portion is kept in a state of non-communication with the outside of the first Si film. Thus, at the Step B-1 (second time), it is possible to prevent the modifying agent from entering the inside of the hollow portion, and to avoid oxidation of at least the bottom portion of the portion of the first Si film which makes contact with the hollow portion (inner wall of the hollow portion). As a result, when the width of the opening of the upper portion of the hollow portion is increased at the Step B-2 (second time), the width of the bottom portion of the hollow portion can be kept without being increased. By making at least the bottom portion of the hollow portion be kept in its original shape, it is possible to allow the vertical cross sectional shape of the opened hollow portion to become a V shape or the like in which the opening width gradually increases from the bottom side toward the surface side, and to improve the filling characteristics in the concave portion by the Si film.

Figure 7A:
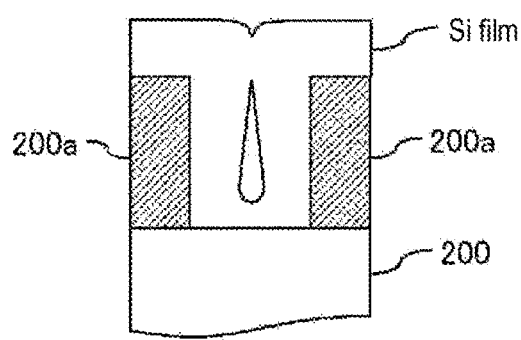
FIG. 7A is an enlarged cross sectional view illustrating a surface structure of a wafer after forming a Si film having a void.
Figure 7D:
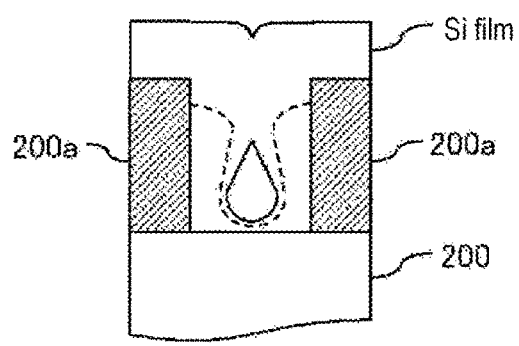
FIG. 7D is an enlarged cross sectional view illustrating a surface structure of a wafer after further forming a Si film on the etched Si film.
Figure 7B:
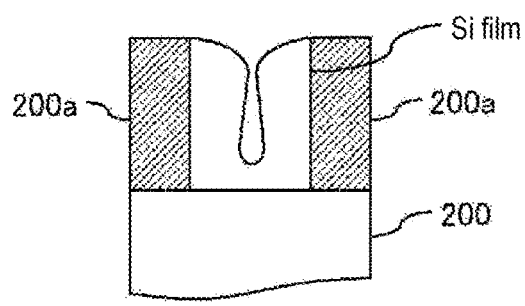
FIG. 7B is an enlarged cross sectional view illustrating a surface structure of a wafer showing a state where an upper portion of the void is opened by etching a portion of the Si film.
Figure 7C:
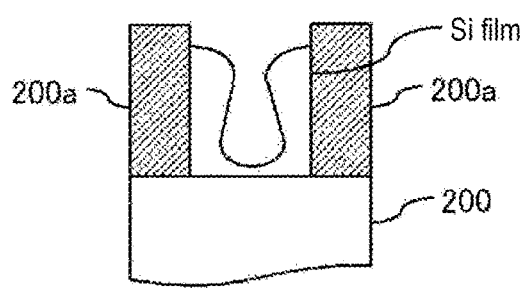
FIG. 7C is an enlarged cross sectional view illustrating a surface structure of a wafer showing a state where an inside of the void of the Si film is etched.

FIG. 7A to FIG. 7D are views illustrating a filling process using a Si film in a concave portion in a comparative example. FIG. 7A is an enlarged cross sectional view illustrating a surface structure of a wafer after forming a Si film having a void in a concave portion formed on a surface of the wafer, FIG. 7B is an enlarged cross sectional view illustrating a surface structure of a wafer showing a state where a portion of the Si film formed in the concave portion is etched using an etching agent and an upper portion of the void is opened. FIG. 7C is an enlarged cross sectional view illustrating a surface structure of a wafer showing a state where the inside of the void of the Si film is etched with an etching agent by continuing the etching even after the upper portion of the void is opened, and FIG. 7D is an enlarged cross sectional view illustrating a surface structure of a wafer after further forming a Si film on the etched Si film. According to this comparative example, when performing FIGS. 7B and 7C, due to the etching agent entering the inside of the void, it can be seen that it is difficult to maintain the width of the bottom portion of the void without increasing it. According to this comparative example, the vertical cross sectional shape of the opened void is processed in a shape in which the opening width gradually increases from the surface side toward the bottom surface side by continuing the etching process. Thus, it can be seen that it is difficult to fill the concave portion with the Si film without a gap, as illustrated in FIG. 7D.

(d) In the Step B, by performing the Steps B-1 and B-2 a plurality of times (here, twice), it is possible to more reliably allow the surface shape of the first Si film after etching, which is finally obtained, i.e., the vertical cross sectional shape of the opened hollow portion, to become a shape suitable for filling (for example, a V shape). This is because, in the Step B, when the Steps B-1 and B-2 are performed a plurality number of times, the modification process of the first Si film, i.e., the etching process of the first Si film, can be controlled more accurately and precisely than when they are performed once.

(e) The effects mentioned above can be similarly achieved in the case where the aforementioned first precursor other than the MS gas is used, or in the case where the aforementioned second precursor other than the MS gas is used, or in the case where a modifying agent other than the $O_2$ gas is used, or in the case where an etching agent other than the HF gas is used, or in the case where an inert gas other than the $N_2$ gas is used.

(4) Exemplary Modifications

The present embodiments may be modified as in the modifications described below. Furthermore, these modifications may be arbitrarily combined. Unless otherwise specified, the processing procedures and processing conditions at each step of each of the modifications may be similar to the processing procedures and processing conditions at each step of the substrate processing sequence described above.

Modification 1

At the Step B, the Steps B-1 and B-2 may be performed twice or more.

When the Steps B-1 and B-2 are performed n times (where n is an integer of 2 or more), at the Step B-1, up to an (n−1)th time of performing the Step B-1, a portion of the first Si film above the hollow portion which does not make contact with the hollow portion is modified In addition, at the Step B-2, up to an (n−1)th time of performing the Step B-2, the modified portion of the first Si film above the hollow portion which does not make contact with the hollow portion is selectively etched, and the hollow portion is kept in a state of non-communication with the outside of the first Si film. Also, at the Step B-1 of an nth time, the portion of the first Si film remaining within the concave portion, which makes contact with the hollow portion (the upper portion or the central portion), is modified, and at the Step B-2 of the nth time, the modified portion of the first Si film remaining within the concave portion, which makes contact with the hollow portion (the upper portion or the central portion), is selectively etched. Then, at the Step B-2 of the nth time, the hollow portion is in communication with the outside of the first Si film.

Even when the Steps B-1 and B-2 are performed twice or more, the same effects as those of the substrate processing sequence illustrated in FIGS. 5A to 5F may be achieved. Furthermore, when the number of executions of the Steps B-1 and B-2 is increased, at the Step B-1, up to the (n−1)th time of performing the Step B-1, a modifying agent having an oxidizing power weaker than the modifying agent used at the Step B-1 of the nth time ($O_2$ gas), for example, a $N_2O$ gas, a NO gas or a $NO_2$ gas, may be used as the modifying agent. In addition, the processing conditions (for example, the processing pressure, the processing temperature, the supply flow rate of the modifying agent, and the supply time of the modifying agent) at the Step B-1 may be adjusted so that the oxidizing power of the modifying agent at the Step B-1, up to the (n−1)th time of performing the Step B-1, is lower than the oxidizing power of the modifying agent at the Step B-1 of the nth time. By reducing the oxidizing power of the modifying agent at the Step B-1, up to the (n−1)th time of performing the Step B-1, it is possible to easily keep the hollow portion in a state of non-communication with the outside of the first Si film at the Step B-2 of the (n−1)th time. Thus, it is possible to reliably prevent the modifying agent from entering the inside of the hollow portion at the Step B-1 of the nth time. As a result, when increasing the opening width of the upper portion of the hollow portion at the Step B-2 of the nth time, it is possible to more reliably maintain the width of the bottom portion of the hollow portion without increasing it.

Modification 2

As illustrated in FIGS. 6A to 6D, at the Step B, the Steps B-1 and B-2 may be performed once.

Figure 6A:
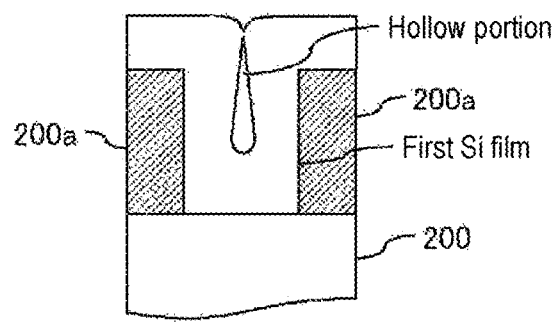
FIG. 6A is an enlarged cross sectional view illustrating a surface structure of a wafer after forming a first film having a hollow portion.
Figure 6D:
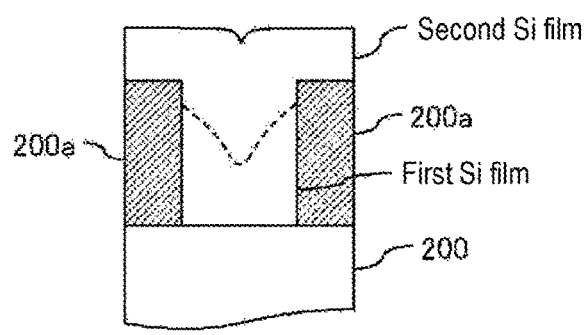
FIG. 6D is an enlarged cross sectional view illustrating a surface structure of a wafer after forming a second film on the first film which is partially etched.
Figure 6B:
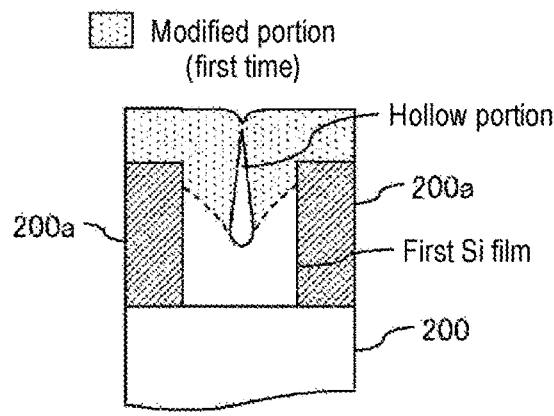
FIG. 6B is an enlarged cross sectional view illustrating a surface structure of a wafer after modifying (first time) a portion of the first film.
Figure 6C:
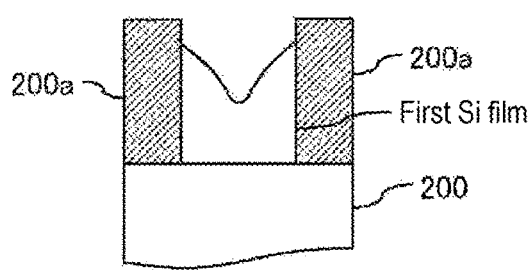
FIG. 6C is an enlarged cross sectional view illustrating a surface structure of a wafer after selectively etching (first time) the modified portion of the first film.

As illustrated in FIG. 6A, at the Step A, the first Si film having a hollow portion is formed so as to fill the concave portion formed in the surface of the wafer 200. The position of the hollow portion is set at, for example, a position higher than the position of the hollow portion illustrated in FIG. 5A. Thereafter, the Step B-1 is performed, and as illustrated in FIG. 6B, the portion of the first Si film which makes contact with the hollow portion (the upper portion or the central portion) is modified. Thereafter, the Step B-2 is performed, and as illustrated in FIG. 6C, the modified portion of the first Si film which makes contact with the hollow portion (the upper portion or the central portion) is selectively etched and the hollow portion is in communication with the outside of the first Si film. Thereafter, the Step C is performed, and as illustrated in FIG. 6D, a second Si film is formed on the first Si film which is partially etched.

Even in this modification, the same effects as those of the substrate processing sequence illustrated in FIGS. 5A to 5F may be achieved. When the position of the hollow portion of the first Si film is set at a relatively high position, it is possible to allow the hollow portion to be opened by performing the Steps B-1 and B-2 once, and further, to allow the vertical cross sectional shape of the opened hollow portion to become a shape suitable for filling. Thus, it is possible to improve the productivity. In this modification, as the modifying agent, a gas having a oxidizing power stronger than the $O_2$ gas, for example, an $O_3$ gas, a $H_2$ gas+$O_2$ gas, or a $H_2$ gas+$O_3$ gas, may also be used.

Modification 3

In the substrate processing sequence illustrated in FIGS. 5A to 5F, there has been described the examples in which the MS gas having the same molecular structure (chemical structure or material) is used as the first precursor and the second precursor, and the first film and the second film are made of an identical material. However, the present embodiments are not limited thereto. For example, gases having different molecular structures may be used as the first precursor and the second precursor. For example, a DS gas may be used as the first precursor, and a MS gas may be used as the second precursor. For example, the first film and the second film may be made of different materials.

Other Embodiments

While one or more embodiments of the present disclosure have been specifically described above, the present disclosure is not limited to the aforementioned embodiments but may be differently modified without departing from the spirit of the present disclosure.

For example, in the aforementioned embodiments or the like, there have been described cases where the concave portion formed on the surface of the wafer 200 is filled with the Si film. However, the present disclosure is not limited thereto, but may also be suitably applied to cases where the concave portion formed on the surface of the wafer 200 may be filled with a Si-based film (Si-containing film) such as a silicon nitride film (SiN film), a silicon carbonitride film (SiCN film), a silicon oxycarbonitride film (SiOCN film), a silicon oxynitride film (SiON film), a silicon oxycarbide film (SiOC film), or the like. In any case, the same O-containing gas as that of the aforementioned embodiments may be used as the modifying agent. In this case, a portion of one of these films is modified into SiO using the O-containing gas. Furthermore, in this case, as in the aforementioned embodiments, a HF gas may be used as the etching agent, and the portion of the one of these films modified into SiO is selectively etched.

Moreover, the present disclosure may also be suitably applied to cases where the concave portion formed on the surface of the wafer 200 is filled with a metal-based film (metal element-containing film) such as a titanium nitride film (TiN film) or the like. When the concave portion is filled with the TiN film, the same O-containing gas as that of the aforementioned embodiments may be used as the modifying agent. In this case, a portion of the TiN film is modified into TiO using the O-containing gas. Furthermore, in this case, for example, hexafluoroacetylacetone ($C_5H_2F_6O_2$, abbreviation: HFAC) may be suitably used as an etching agent containing H and F. In this case, the portion of the TiN film modified into TiO is selectively etched using HFAC.

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the processing while avoiding an operation error.

The recipes mentioned above are not limited to newly-prepared ones but may be prepared by, for example, modifying the existing recipes already installed in the substrate processing apparatus. When the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described the examples in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have beet described the examples in which films are formed using the substrate processing apparatus provided with a hot-wall-type process furnace. The present disclosure is not limited to the aforementioned embodiments but may be appropriately applied to a case where films are form d using a substrate processing apparatus provided with a cold-wall-type process furnace. Even in the case of using these substrate processing apparatuses, the substrate processing may be performed by the sequences and processing conditions similar to those of the embodiments and modifications described above, and effects similar to those of the embodiments and modifications described above may be achieved.

The films formed by the method of the aforementioned embodiments may be suitably used for an application such as formation of a contact plug by filling a contact hole.

The embodiments, modifications, and the like described above may be appropriately combined with one another. The processing procedures and processing conditions in this operation may be similar to, for example, the processing procedures and processing conditions of the aforementioned embodiments.

According to the present disclosure in some embodiments, it is possible to improve filling characteristics of a film in a concave portion formed on a surface of a substrate.

While certain embodiments have been described, these embodiments have been presented by way of example only, and are riot intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    filling a concave portion formed on a surface of the substrate with a first film and a second film by performing:
    (a) forming the first film having a hollow portion using a first precursor so as to fill the concave portion formed on the surface of the substrate;
    (b) etching a portion of the first film which makes contact with the hollow portion, using an etching agent; and
    (c) forming the second film on the first film of which the portion is etched, using a second precursor,
    wherein (b) includes performing, a predetermined number of times:
        (b-1) modifying the portion of the first film using an oxidizing agent as a modifying agent to form a modified portion; and
        (b-2) selectively etching the modified portion of the first film using the etching agent,
    wherein (b-1) and (b-2) are performed n times where n is an integer of 2 or more,
    wherein in (b-1), up to an (n−1)th time of performing (b-1), a portion of the first film, which is disposed above the hollow portion and does not make contact with the hollow portion, is modified, and
    wherein in (b-2), up to an (n−1)th time of performing (b-2), the modified portion of the first film, which is disposed above the hollow portion and does not make contact with the hollow portion, is selectively etched.

2. The method according to claim 1, wherein in (b-2), up to the (n−1)th time of performing (b-2), the hollow portion is kept in a state of non-communication with an outside of the first film.

3. The method according to claim 1, wherein in (b-1) of an nth time, the portion of the first film remaining within the concave portion, which makes contact with the hollow portion, is modified, and
    in (b-2) of the nth time, the modified portion of the first film remaining within the concave portion, which makes contact with the hollow portion, is selectively etched.

4. The method according to claim 3, wherein in (b-2) of the nth time, the hollow portion becomes in communication with an outside of the first film.

5. The method according to claim 1, wherein in (b-2), an etching agent having an etching rate of the modified portion of the first film that is higher than an etching rate of an unmodified portion of the first film is used as the etching agent.

6. The method according to claim 1, wherein in (b-2), the etching is performed under a condition in which an etching rate of the modified portion of the first film is higher than an etching rate of an unmodified portion of the first film.

7. The method according to claim 1, wherein in (b-2), an etching agent for etching the modified portion of the first film without etching an unmodified portion of the first film is used as the etching agent.

8. The method according to claim 1, wherein in (b-2), the etching is performed under a condition in which the modified portion of the first film is etched without etching an unmodified portion of the first film.

9. The method according to claim 1, wherein in (b-1), the portion of the first film is oxidized by using the oxidizing agent, and
    in (b-2), the portion of the first film that is oxidized is selectively etched.

10. The method according to claim 1, wherein in (a), a silicon-based film is formed as the first film,
    in (b-1), a portion of the silicon-based film is oxidized by using the oxidizing agent, and
    in (b-2), the portion of the silicon-based film that is oxidized is selectively etched.

11. The method according to claim 1, wherein in (a), a metal-based film is formed as the first film,
    in (b-1), a portion of the metal-based film is oxidized by using the oxidizing agent, and
    in (b-2), the portion of the metal-based film that is oxidized is selectively etched.

12. The method according to claim 1, wherein a molecular structure of the first precursor is identical to a molecular structure of the second precursor, and
    a material of the first film is identical to a material of the second film.

13. A substrate processing apparatus, comprising:
    a process chamber in which a substrate is processed;
    a precursor supply system configured to supply a first precursor and a second precursor into the process chamber;
    a modifying agent supply system configured to supply a modifying agent into the process chamber;
    an etching agent supply system configured to supply an etching agent into the process chamber; and
    a controller configured to control the precursor supply system, the modifying agent supply system, and the etching agent supply system so as to perform a process in the process chamber, the process comprising filling a concave portion formed on a surface of the substrate with a first film and a second film by performing:
    (a) forming the first film having a hollow portion using the first precursor so as to fill the concave portion formed on the surface of the substrate;
    (b) etching a portion of the first film which makes contact with the hollow portion, using the etching agent; and
    (c) forming the second film on the first film of which the portion is etched, using the second precursor,
    wherein (b) includes performing, a predetermined number of times:
        (b-1) modifying the portion of the first film using an oxidizing agent as the modifying agent to form a modified portion; and
        (b-2) selectively etching the modified portion of the first film using the etching agent,
    wherein (b-1) and (b-2) are performed n times where n is an integer of 2 or more,
    wherein in (b-1), up to an (n−1)th time of performing (b-1), a portion of the first film, which is disposed above the hollow portion and does not make contact with the hollow portion, is modified, and
    wherein in (b-2), up to an (n−1)th time of performing (b-2), the modified portion of the first film, which is disposed above the hollow portion and does not make contact with the hollow portion, is selectively etched.

14. A non-transitory computer-readable recording medium storing a program that causes, by a computer, a substrate processing apparatus to perform a process in a process chamber of the substrate processing apparatus, the process comprising filling a concave portion formed on a surface of a substrate with a first film and a second film by performing:
    (a) forming the first film having a hollow portion using a first precursor so as to fill the concave portion formed on the surface of the substrate;

(b) etching a portion of the first film which makes contact with the hollow portion, using an etching agent; and (c) forming the second film on the first film of which the portion is etched, using a second precursor, wherein (b) includes performing, a predetermined number of times:

(b-1) modifying the portion of the first film using an oxidizing agent as a modifying agent to form a modified portion; and (b-2) selectively etching the modified portion of the first film using the etching agent, wherein (b-1) and (b-2) are performed n times where n is an integer of 2 or more, wherein in (b-1), up to an (n−1)th time of performing (b-1), a portion of the first film, which is disposed above the hollow portion and does not make contact with the hollow portion, is modified, and wherein in (b-2), up to an (n−1)th time of performing (b-2), the modified portion of the first film, which is disposed above the hollow portion and does not make contact with the hollow portion, is selectively etched.

15. The method according to claim 1, wherein in (a), a surface side of the concave portion is closed by the first film which is grown to overhang from a side portion and an upper portion of the concave portion.

16. The method according to claim 1, wherein (b-1) is performed in a state where the hollow portion is in non-communication with an outside of the first film.

17. The method according to claim 1, wherein (b-1) is performed in a state where the hollow portion is in non-communication with an outside of the first film to prevent the modifying agent from entering an inside of the hollow portion.

18. A method of manufacturing a semiconductor device, comprising
processing the substrate according to the method of claim 1.

* * * * *